INVENTORS
PAUL P. CASTRUCCI
EDWARD G GROCHOWSKI
MARTIN S. HESS
ELIAS B. ZACHOS

BY Robert J Haase
ATTORNEY

United States Patent Office 3,723,200
Patented Mar. 27, 1973

3,723,200

EPITAXIAL MIDDLE DIFFUSION ISOLATION TECHNIQUE FOR MAXIMIZING MICROCIRCUIT COMPONENT DENSITY

Paul P. Castrucci, Poughkeepsie, Edward G. Grochowski, Wappingers Falls, Martin S. Hess, Poughkeepsie, and Elias B. Zachos, Hopewell Junction, N.Y., assignors to International Business Machines Corporation, Armonk, N.Y.

Filed Jan. 26, 1970, Ser. No. 5,449
Int. Cl. H01l 7/00, 19/00
U.S. Cl. 148—175 4 Claims

ABSTRACT OF THE DISCLOSURE

A monolithic microcircuit fabrication method employing an optimized middle isolation technique for producing specific vertical diffusion walls of minimum critical horizontal dimensions is disclosed to facilitate maximum density of electrically isolated microcircuit components. A first epitaxial layer is grown on a semiconductor substrate and regions of isolation impurities are placed therein at desired locations. A second epitaxial layer is grown over the first epitaxial layer (while the impurities out-diffuse into both epitaxial layers) until the non-isolated thickness remaining in the first epitaxial layer becomes equal to the non-isolated thickness remaining in the second epitaxial layer. Subsequent conventional heat treatment steps such as are required for the oxidation and diffusion cycles of typical microcircuit components continue the out-diffusion of the impurity regions so as to form completed vertical isolation walls between said components.

BACKGROUND OF THE INVENTION

Higher densities of integration at the semiconductor chip level are constantly being sought within the capability of existing technology. A major limitation in the quest for maximum component density in monolithic devices is the need for electrical isolation between the components. Such isolation typically is provided by vertical impurity diffusions through an epitaxial layer (in which the circuit components are formed) down to the underlying substrate having the same conductivity type as the isolation diffusions. A significant portion of the available circuit chip geometry is allocated to the isolation diffusion regions. It is advantageous, therefore, to provide isolation-diffusion regions of minimum horizontal cross-section particularly at those depths within the epitaxial layer where the active circuit components exhibit maximum horizontal dimensions.

Various prior art proposals have been made for the production of vertical isolation walls in monolithic microcircuit chips. For example, U.S. Pat. 3,260,902 to Porter teaches the placement of isolation impurity regions at desired locations on a semiconductor substrate, growing an epitaxial layer of opposite conductivity type over the substrate and then subjecting the epitaxial layer and substrate to heat treatment whereby the isolation impurities out-diffuse completely through a vertical wall region of the overlying epitaxial layer. U.S. Pat. 3,379,584 to Bean et al. discloses the placement of isolation impurity regions at desired locations on a substrate, growing a first epitaxial layer on the substrate, placing second isolation impurity regions in the first epitaxial layer in registration with the first regions, growing a second epitaxial layer on top of the first epitaxial layer, placing third isolation impurity regions in the second epitaxial layer in registration with the first and second regions, and then heat treating the entire structure so as to out-diffuse all three impurity regions and form the desired vertical isolation walls. None of the known prior art teachings, however, addresses the problem of achieving vertical isolation walls which occupy a minimum amount of chip material at critical depths within the chip thereby permitting maximum packing density of isolated active circuit components. For example, where the isolated circuit component is an epitaxial transistor, the subcollector and base diffusions near the lower and upper surfaces, respectively, of the epitaxial layer have the greatest horizontal dimension. Maximum component packing density requires that the isolation walls between the adjacent transistors present a minimum horizontal dimension at the depths of the subcollector and base diffusions consistent with the attainment of adequate electrical isolation.

SUMMARY OF THE INVENTION

The method of the present invention provides shaped vertical isolation walls having minimum horizontal dimensions adjacent to the upper and lower surfaces of a composite epitaxial layer in which isolated circuit components are to be formed. The method comprises growing a first epitaxial layer of a first conductivity type on a semiconductor substrate of the opposite conductivity type. Isolation impurity regions are formed in the first epitaxial layer at desired surface locations. A second epitaxial layer of the same conductivity type as the first epitaxial layer is grown over the first epitaxial layer with concomitant out-diffusion of the impurity regions into both epitaxial layers. Growth of the second epitaxial layer is continued until the non-diffused thickness of the first epitaxial layer is approximately equal to the non-diffused thickness of the second epitaxial layer. The isolation impurity regions thus are located approximately mid-way within the total thickness of the combined epitaxial layers when the growth of the second epitaxial layer is terminated. Finally, the semiconductor structure is subjected to additional heat treatment which continues the out-diffusion of the impurity regions until they reach completely between the upper and lower surfaces of the combined epitaxial layers with sufficient surface concentration to achieve adequate electrical isolation. Such additional heat treatment steps conveniently are those normally associated with the formation of circuit components within the isolated regions of the epitaxial layer. For example, the base and emitter oxide masking and diffusion steps for forming transistors within the isolated regions provide sufficient heat treatment to complete the out-diffusion of the isolation regions.

DESCRIPTION OF THE PREFERRED EMBODIMENT

Figure 4:
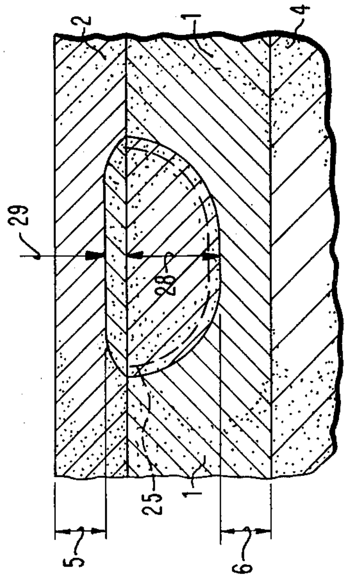
Figure 5:
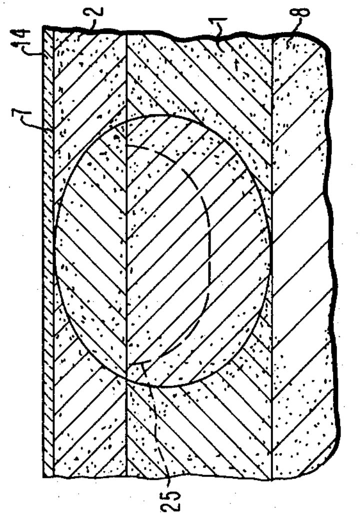
Figure 6:
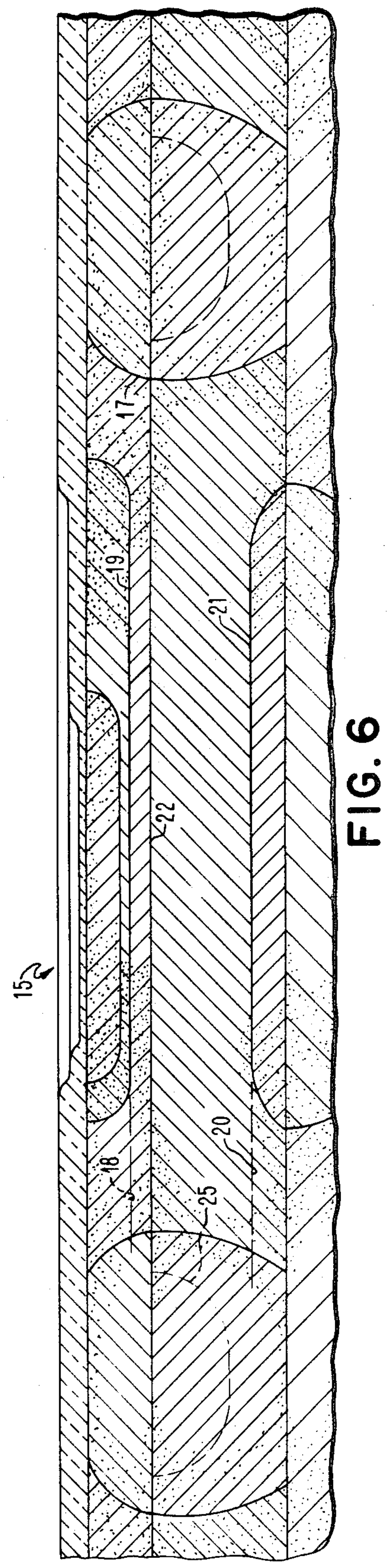

Referring briefly to FIGS. 2, 3, 4, 5 and 6, there is provided a substrate 4 of semiconductor material of a given conductivity type. Epitaxial layer 1 of the opposite conductivity type is grown over substrate 1. An isolation impurity region 3 of the same conductivity type as the substrate 4 is placed in epitaxial layer 1. For example, region 3, epitaxial layer 1 and substrate 4 may be of p, n and p conductivity types, respectively. Epitaxial layer 2 is grown over epitaxial layer 1 and causes a partial out-diffusion of the original impurity region 3 into epitaxial layer 2 and deeper into epitaxial layer 1. The original impurity region is represented by dotted line 25. The growth of epitaxial layer 2 is continued until the point is reached as shown in FIG. 4 when the non-diffused thickness 5 of epitaxial layer 2 is approximately equal to the non-diffused thickness 6 of epitaxial layer 1. Subsequent heat processing, such as is, would be normally associated with the fabrication of microelectronic circuit components in the isolated regions of the composite epitaxial layers continues the out-diffusion of the original impurity region 3 from the top surface 7 of the composite epitaxial layer to the bottom surface 8 thereof as shown in FIGS. 5 and 6.

Figure 1:
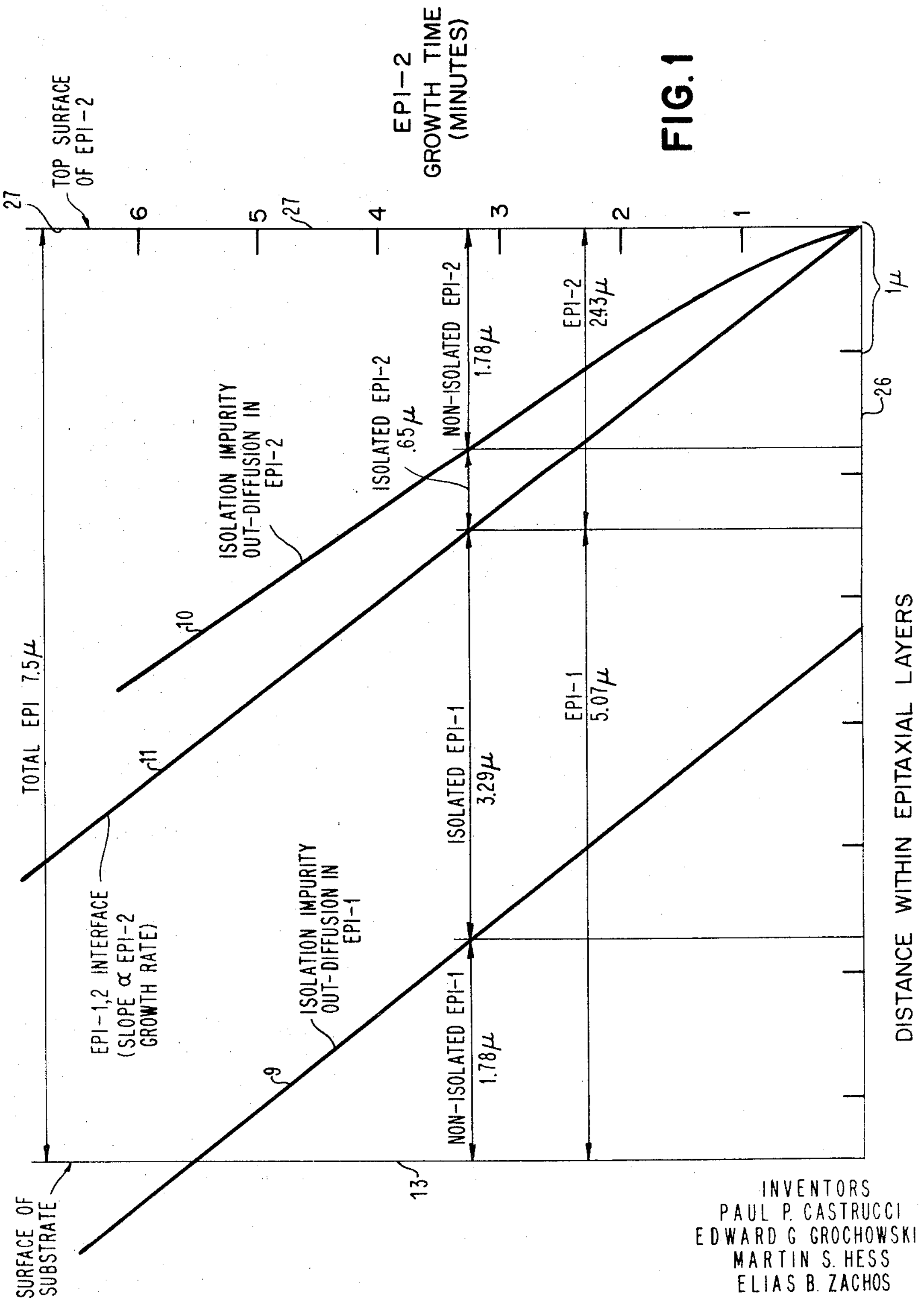
FIG. 1 is a graph depicting epitaxial layer growth rate and isolation impurity out-diffusion rates for designing a typical embodiment of the present invention.
Figure 2:
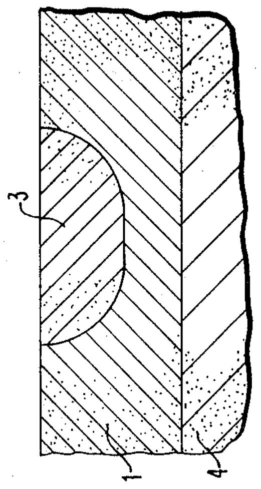
FIGS. 2, 3, 4, 5 and 6 comprise a time sequence of cross-sectional views of a monolithic semiconductor device being constructed in accordance with the present method.
Figure 3:
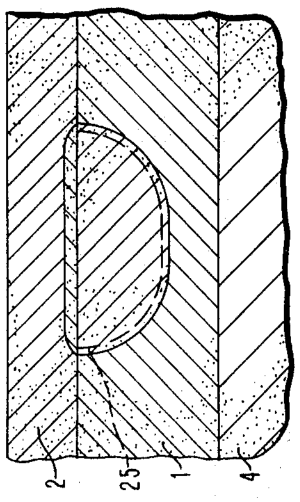

The manner in which the partially out-diffused impurity region 3 is made to occupy a position approximately mid-way in the composite epitaxial layer as shown in FIG. 4 may be understood by reference to the graph of FIG. 1. For the purpose of exemplification, one set of typical parameter values will be used in the following discussion. Distance within the epitaxial layers is plotted along the axis of abscissas 26 whereas diffusion times and epitaxial growth times are plotted along the axis of ordinates 27 in FIG. 1. FIG. 1 is a graphical solution of the mathematical relationships which establish the values of the thicknesses of epitaxial layers 1 and 2 and the out-diffusion of impurity region 3 to yield the structure shown in FIG. 4.

It is assumed in the exemplary case that the desired total epitaxial layer thickness is 7.5 microns and the resistivity of both constituent epitaxial layers 1 and 2 is 0.1 ohm-centimeters as determined by conventional monolithic microelectronic circuit design considerations. Typical diffusion parameters for isolation impurity region 3 include a boron concentration of $3.5\times10^{20}$ atoms per cubic centimeter and a diffusion time of 25 minutes at 1200° C. From the given parameter values, the depth of the impurity region 3 in epitaxial layer 1 can be calculated from known theory. In the example under consideration, said depth is 3.23 microns. It is further assumed that epitaxial layer 2 is grown at a rate of about 0.75 micron per minute at a growth temperature of 1150° C., these being typical values. From the known concentration of impurity region 3 and the known growth parameters of epitaxial layer 2, the out-dicusion of impurity region 3 into epitaxial layer 2 and deeper into epitaxial layer 1 may be calculated as a function of time. The results of such calculations appear in the following table:

| Growth time of epi 2 (minutes) | Out-diffusion into epitaxial layer 1 (microns) | Out-di ffusion into epitaxial layer 2 (microns) |
|---|---|---|
| 1 | 3.25 | .36 |
| 2 | 3.27 | .50 |
| 3 | 3.29 | .62 |
| 4 | 3.31 | .71 |
| 5 | 3.33 | .80 |
| 6 | 3.35 | .87 |

The out-diffusion of the impurity region 3 into epitaxial layer 1 as a result of the temperature associated with the growth of epitaxial layer 2 is represented by curve 9 of FIG. 1. The out-diffusion of the impurities into epitaxial layer 2 during the same time is represented by curve 10. The growth of epitaxial layer 2 as a function of time is represented by curve 11. The axis of ordinates 27 also may be considered as repserenting the top surface of epitaxial layer 2 while line 13 (parallel to axis 27) may be considered as representing the interface between epitaxial layer 1 and substrate 4 of FIGS. 2–6. Curves 9 and 10 of FIG. 1 are plotted in accordance with the illustrative values given in the above table.

It can be seen that for the given curves 9, 10 and 11 there exists one point in time when the growth of epitaxial layer 2 and the out-diffusion of the impurity region into epitaxial layers 1 and 2 satisfy the condition shown in FIG. 4 that the non-diffused thickness 6 of epitaxial layer 1 is approximately equal to the non-diffused thickness 5 of epitaxial layer 2. This condition is reached in the illustrative case after 3.24 minutes of growth of epitaxial layer 2 when both non-isolated thicknesses of epitaxial layers 1 and 2 are equal to 1.78 microns. The isolated thicknesses 28 and 29 of epitaxial layers 1 and 2, respectively, are 3.29 microns and 0.65 micron, respectively, at the same time.

It will be noted that additional heat treatment is required to complete the out-diffusion of the impurity region 3 so that it completely reaches through the composite epitaxial layer comprising layers 1 and 2 as shown in FIGS. 5 and 6. A feature of the present method is that the required additional out-diffusion may be achieved in due course as a direct consequence of conventional processing steps for forming semiconductor devices within the isolated region of the composite epitaxial layer. In FIG. 5, for example, a layer of silicon dioxide 14 is grown over the upper surface 7 of the composite epitaxial layer to provide a mask for the base diffusion of transistor 15 of FIG. 6. The heat treatment associated with the growth of silicon dioxide layer 14 continues the out-diffusion of impurity region 3 until it substantially reaches through the entire thickness of the composite epitaxial layer. It is desirable, of course, that the impurity out-diffusion be continued until the impurity concentration at surface 7 is sufficient to overcome any possible surface inversions and to insure effective electrical isolation. A surface concentration at least of the order of $10^{18}$ atoms per cubic centimeter is sufficient for this purpose. Said surface concentration conveniently is realized upon the completion of the conventional base and emitter diffusion steps to yield the structure shown in FIG. 6.

It should be observed with respect to FIG. 6 that the shaped isolation walls 16 and 17 are characterized by reduced horizontal dimensions at the depth represented by reference line 18 which also is the depth of the collector junction 19 of transistor 15. Such reduced horizontal dimensions permit isolation walls 16 and 17 and transistor 15 to be brought close together in a maximum device density configuration.

It should also be noted that the horizontal dimension of isolation walls 16 and 17 is reduced along the line 20 which coincides with the depth occupied by buried subcollector 21. The maximum horizontal dimension of the isolation walls 16 and 17 lies along the interface 22 between the first and second epitaxial layers. However, the components to be isolated exhibit maximum horizontal dimensions along other lines such as lines 18 and 20. Thus, the vertical isolation walls produced by the method of the present invention are shaped in a fashion complimentary to the diffusion profile of the component to be isolated with maximum wall horizontal dimension being in juxtaposition with minimum component horizontal dimension and vice-versa. A similar relationship obtains in the event that other microcircuit components such as diffused resistors, diodes or capacitors be introduced into the isolated region rather than the transistor depicted in the representative embodiments of FIGS. 2–6. In each case, the unavoidable, horizontal diffusion accompanying the desired vertical diffusion of the impurity region is concentrated at a non-critical depth within the composite epitaxial layer to permit optimum use of the available semiconductor material for the active microcircuit components. The present technique is particularly advantageous for thick epitaxial film designs affording higher DC voltage breakdowns and wider base widths than are possible with prior art isolation diffusion techniques.

While this invention has been particularly described with reference to the preferred embodiments thereof, it will be understood by those skilled in the art that the forgoing and other changes in form and details may be made therein without departing from the spirit and scope of the invention.

What is claimed is:

1. In a method for producing shaped isolation walls within a composite semiconductor epitaxial layer of one conductivity type on a semiconductor substrate of the other conductivity type, the steps comprising:

providing said substrate;

growing a first epitaxial layer of said one conductivity type on said substrate;

placing solely isolation wall impurity regions of said other conductivity type in said first epitaxial layer at desired surface locations;

growing a second epitaxial layer of said one conductivity type on said first epitaxial layer at a temperature and for a time to cause the partial out-diffusion of said regions into said first and second epitaxial layers until there remain non-diffused regions of approximately equal thicknesses in said first and second epitaxial layers, said impurity regions when placed in said first epitaxial layer initially having an impurity concentration greater than those of said first and second epitaxial layers, stopping the growth of said second epitaxial layer at said time, and heat treating said partially out-diffused regions to complete said out-diffusion through said non-diffused regions to form isolation walls through said composite epitaxial layer reaching from said substrate to the surface of said second epitaxial layer remote from said substrate.

2. The method defined in claim 1 and further including diffusing additional impurities into the regions of said composite epitaxial layer isolated by said walls to form microcircuit devices therein, said heat treating comprising the heat treatment required for the diffusion of said additional impurities.

3. The method defined in claim 1 and further including diffusing additional impurities into the regions of said composite epitaxial layer isolated by said walls to form microcircuit devices therein, said heat treating consisting of the heat treatment required for the diffusion of said additional impurities.

4. The method defined in claim 1 wherein said heat treating is continued until the impurity concentration from the out-diffused impurity regions at the surface of said second epitaxial layer remote from said substrate is at least of the order of $10^{18}$ atoms per cubic centimeter.

References Cited

UNITED STATES PATENTS

| | | | |
|---|---|---|---|
| 3,327,182 | 6/1967 | Kisinko | 317—235 |
| 3,414,782 | 12/1968 | Lin et al. | 317—235 |
| 3,089,794 | 5/1963 | Marinace | 148—1.5 |
| 3,260,624 | 7/1966 | Wiesner | 148—175 |
| 3,335,341 | 8/1967 | Lin | 317—235 |
| 3,380,153 | 4/1968 | Husher et al. | 29—577 |
| 3,427,513 | 2/1969 | Hilbiber | 317—235 |
| 3,479,233 | 11/1969 | Lloyd | 148—174 |
| 3,481,801 | 12/1969 | Hugle | 148—175 |
| 3,547,716 | 12/1970 | DeWitt et al. | 148—175 |
| 3,595,713 | 7/1971 | Brebisson et al. | 148—175 |

OTHER REFERENCES

Donald, R. G.: "Complementary Integrated Circuit Structure," Proc. of IEEE, vol. 54, No. 10, October 1966, pp. 1488–1490.

L. DEWAYNE RUTLEDGE, Primary Examiner

W. G. SABA, Assistant Examiner

U.S. Cl. X.R.

29—577; 117—201, 215; 148—187, 191; 317—235 R